(12) United States Patent
Tain et al.

(10) Patent No.: US 7,381,995 B2
(45) Date of Patent: Jun. 3, 2008

(54) LIGHTING DEVICE WITH FLIPPED SIDE-STRUCTURE OF LEDS

(75) Inventors: Ra-Min Tain, Chung-Ho (TW);
Shyi-Ching Liau, Hsinchu Hsien (TW);
Chien-Cheng Yang, Taipei Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 408 days.

(21) Appl. No.: 11/081,319

(22) Filed: Mar. 16, 2005

(65) Prior Publication Data

US 2006/0220030 A1    Oct. 5, 2006

(51) Int. Cl.
*H01L 31/12*    (2006.01)

(52) U.S. Cl. .................. 257/82; 257/99; 257/432; 257/E25.032

(58) Field of Classification Search .............. None
See application file for complete search history.

(56) References Cited

U.S. PATENT DOCUMENTS

| | | | |
|---|---|---|---|
| 5,739,552 A * | 4/1998 | Kimura et al. ............. 257/89 |
| 6,474,531 B2 * | 11/2002 | Ozawa ..................... 228/103 |
| 6,608,614 B1 | 8/2003 | Johnson .................... 345/102 |
| 6,614,058 B2 * | 9/2003 | Lin et al. ................... 257/99 |
| 6,642,547 B2 * | 11/2003 | Matsubara et al. ......... 257/98 |
| 6,666,567 B1 | 12/2003 | Feldman et al. ........... 362/237 |
| 6,998,642 B2 * | 2/2006 | Lin et al. ................... 257/79 |
| 2005/0167680 A1 * | 8/2005 | Shei et al. .................. 257/79 |
| 2005/0189551 A1 * | 9/2005 | Peng et al. ................. 257/94 |

* cited by examiner

Primary Examiner—Alonzo Chambliss

(57) ABSTRACT

Disclosed is a lighting device with flipped side-structure of LEDs, which allows emitted lights to travel in parallel with the mounting surface. Single or plural LED chips are mounted on a substrate with their side surfaces facing the substrate surface. The lighting device can be further combined with optical protrusions on the substrate to form a light module for reflecting and mixing lights emitted from the LED chips. It does not require a conventional wire bonding process. The packaging structure also resolves the heat dissipation problem of the LEDs. Electrostatic discharge protection circuits can be included in the light module if desired. The invention achieves good uniformity and high intensity of the combined lights with desired chromaticity.

20 Claims, 17 Drawing Sheets

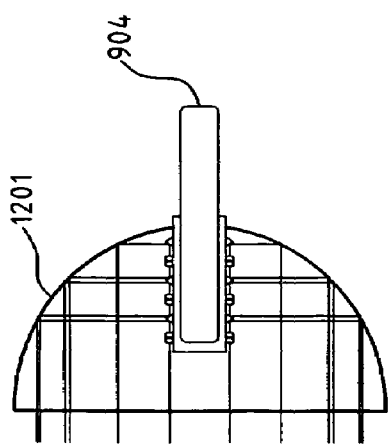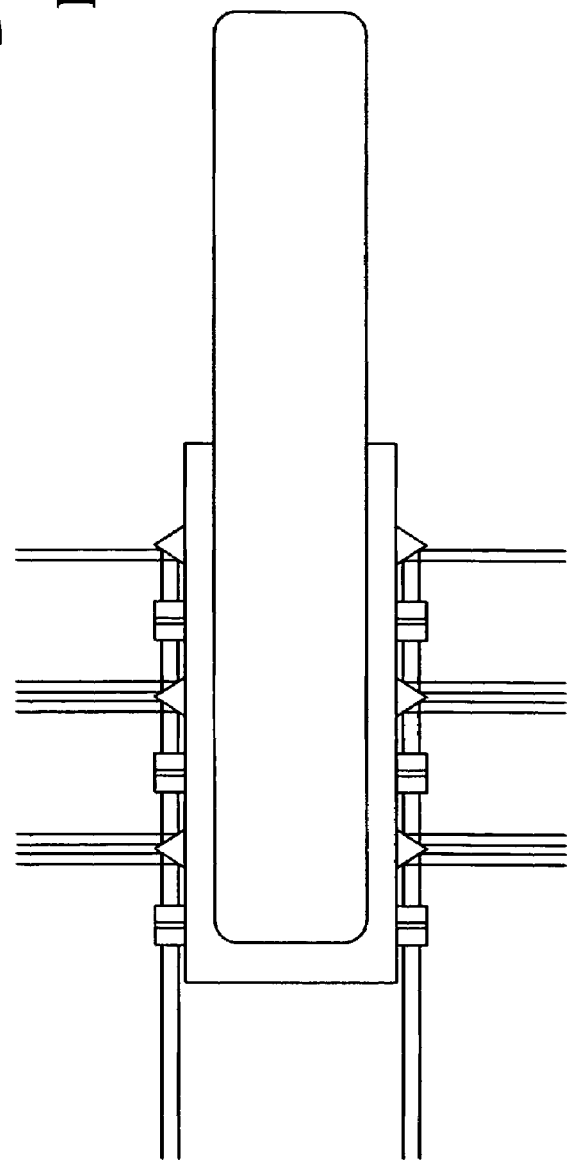

LIGHTING DEVICE WITH FLIPPED SIDE-STRUCTURE OF LEDS

FIELD OF THE INVENTION

The present invention generally relates to light emitting diode (LED) devices, and more specifically to a lighting device with flipped side-structure of LEDs.

BACKGROUND OF THE INVENTION

A light source for illuminating an information source is often required in many applications. In particular, liquid crystal displays (LCDs) have become more and more popular in many electronic media LCDs are commonly adopted in various applications, such as laptop computers, display monitors, video cameras, automatic teller machine displays, displays in avionics, televisions etc. In general, a backlight module is required for the LCDs to illuminate the information to be displayed. There are various kinds of light sources used in a backlight module of an LCD, e.g., fluorescent lamps and LEDs. While the fluorescent lamps are inexpensive and do not need complex control circuitry. They are sometimes inadequate for certain applications that require good color quality and long lamp life.

LEDs have been proposed for use as light sources, such as LCD backlight modules, for many reasons. These advantages of LED light sources include long life, ease of replacement, robust mechanical property, and better color quality than fluorescent lamps. Certain applications (e.g., avionics) require a specific chromaticity of light emitted from the LCD backlight module. However, most commercially available LEDs are made with a limited number of chromaticity choices and their chromaticity may change over time.

An LED light source with a raised LED 100, as shown in FIG. 1, to improve the chromaticity of a combined light was disclosed in U.S. Pat. No. 6,666,567. The raised LED 100 includes an LED diode 101 encased in a package 102 which is raised above the floor 103 of optical cavities. The raised structure permits light to be emitted from the base of the LED. Additionally, reflective protrusions may be placed beneath the raised LED to aid in redirecting the light trajectory. A combination of fluorescent lamps and LEDs were also proposed to form a hybrid light source. However, all these schemes increase the complexity and cost of the light source.

As shown in FIG. 2 and FIG. 3, an LCD backlight 200, which includes a first LED array 201 that provides light with a first chromaticity and a second LED array 202 that provides light with a second chromaticity, was disclosed in another U.S. Pat. No. 6,608,614. The lights emitted from these two LED arrays 201 and 202 are combined through a combining element 301 (e.g., a wave guide) and then projected towards an LCD stack 302. The LED chip normally emits light in a direction which is approximately perpendicular to the chip surface. The directions of light emitted from the first and the second LED arrays are approximately perpendicular and parallel to the panel surface, respectively. A separate combining element 301 is required in this light source. The chromaticity of the combined light can only be adjusted by changing the chromaticity of the second LED array 202 through a control system (not shown). Therefore, there is a limited flexibility for chromaticity adjustment.

According to another prior art, a Luxeon side-emitter having packaged LED chips was disclosed, as shown in FIG. 4. The side-emitter may provide good uniformity of combined light but the light intensity is poor. In addition, packaged LED chips normally occupy a much larger area than the bare chips scheme of the present invention. It is known that the majority of lights emitted from LED chips travel in a direction approximately perpendicular to the chip surface. Therefore, the LED chips need to be arranged in a way such that the lights emitted from different LED chips have a chance to be combined and mixed in order to achieve desired chromaticity before they reach a display screen.

In a conventional LED packaging structure shown in FIG. 5, an LED chip 500 is attached to a packaging substrate 511. The LED chip comprises a negative electrode (bonding pad) 501, an n-type cladding layer 503, an active layer 504, a p-type cladding layer 505, a semiconductor substrate layer (e.g., GaAs or GaN) 506, and a positive bonding electrode (bonding pad) 502. The negative electrode 501 of the LED chip 500 is connected through a gold or aluminum wire 512 to a negative bonding pad 513 on the packaging substrate 511, and the positive electrode 502 is soldered on a positive bonding pad 514 on the packaging substrate 511. The LED chip 500 and the gold wires 512 are then covered with a transparent resin 515 to isolate them from the outside environment. Only the metal pads or the connection pins 513 and 514 are left exposed for power source connection. The disadvantage of this LED structure is poor light intensity because the non-transparent metal pads 501 and 502 block a significant portion of the emitted lights. Moreover, the requirement of a conventional wire bonding process increases its process complexity, package size, and cost

SUMMARY OF THE INVENTION

The present invention has been made to overcome the drawbacks of conventional light sources. It eliminates the need of a conventional wire bonding process and a package for encasing an LED chip, and thus reduces cost and space. A high light intensity with desired chromaticity is also achieved due to a high LED packaging density and a proper mix of the emitted lights.

According to the present invention, every LED chip has an n-bonding pad and a p-bonding pad. One bonding pad of the LED chip is located on the front surface and the other on the back surface. Either n- or p-bonding pad can be disposed on the front surface of the LED chip and occupies only a small fraction of the chip area. The other bonding pad covers the entire back surface of the chip with a metal reflection layer placed in between the back bonding pad and the remaining part of the LED chip.

In a first embodiment of the invention, the lighting device with flipped side-structure of LEDs comprises two LED chips and a substrate. Two LED chips are attached back-to-back and mounted on the substrate with their side surfaces facing the mounting surface. The n- and p-bonding pads of the LED chip are bonded to the n- and p-electrode pads on the substrate, respectively.

In a second embodiment, the lighting device with flipped side-structure of LEDs comprises an LED chip and a substrate. The LED chip is mounted on the substrate with its side surface facing the mounting surface. The n-bonding pad and p-bonding pad of the LED chip are bonded to the n-electrode pad and p-electrode pad on the substrate, respectively.

In a third embodiment, the lighting device with flipped side-structure of LEDs of the present invention is further combined with optical protrusions on the substrate to form a light module for reflecting and mixing lights emitted from the LED chips. The LED chips are formed on a substrate facing the optical protrusions to form an LED luminance sources. Therefore, the emitted lights from different LEDs have a chance to be reflected and combined near the substrate surface in order to achieve desired chromaticity.

If desired, a control circuitry can be formed on the substrate to power up the LEDs, to control the brightness of the LEDs, to provide electrostatic discharge protection for the LEDs, and to adjust the chromaticity of the combined light to meet desired applications.

The present invention achieves good uniformity and high intensity of the combined lights with desired chromaticity.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

FIGS. 12A and 12B are application examples of an LED lamp without or with a reflective bowl according to the third embodiment of the present invention.

DETAILED DESCRIPTION OF THE PREFERRED EMBODIMENTS

Figure 1:
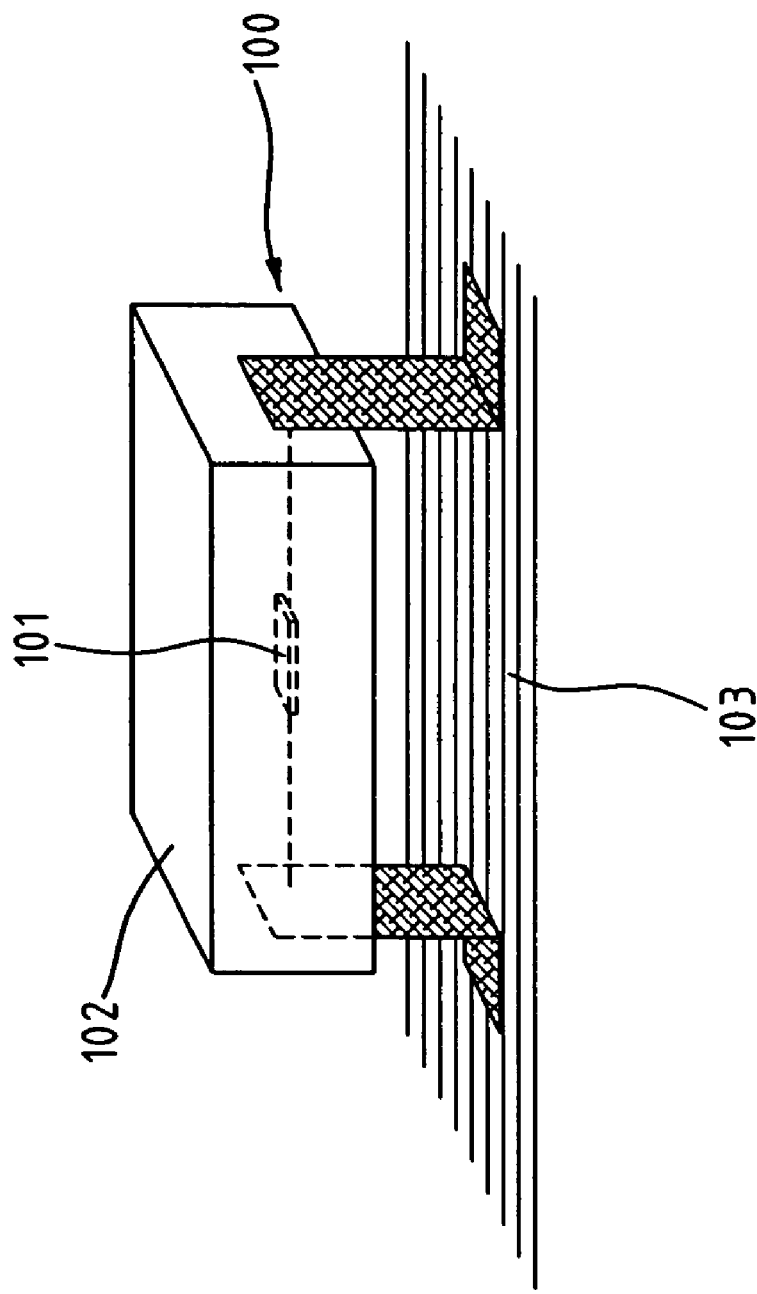
FIG. 1 shows a conventional raised LED structure.
Figure 2:
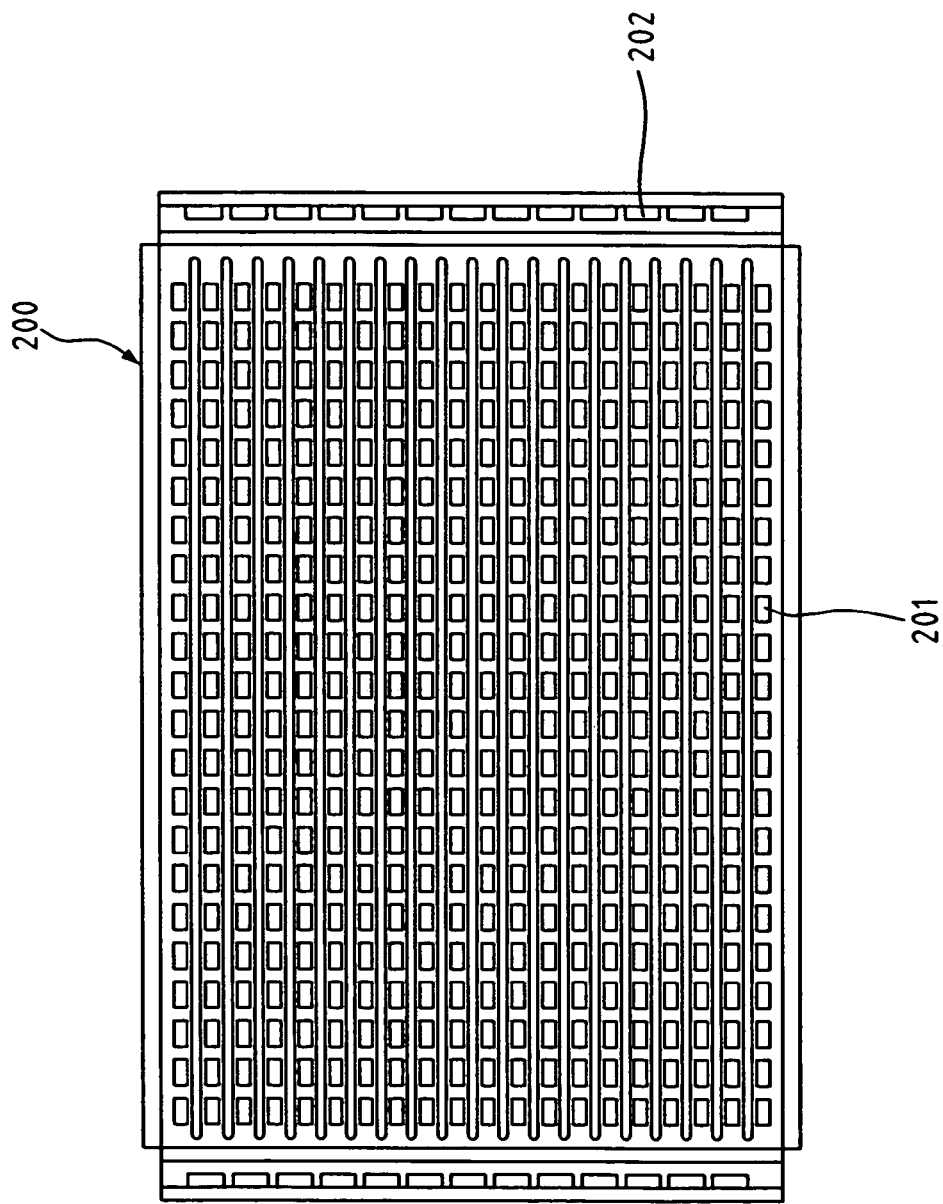
FIG. 2 shows a conventional LED-based LCD backlight.
Figure 3:
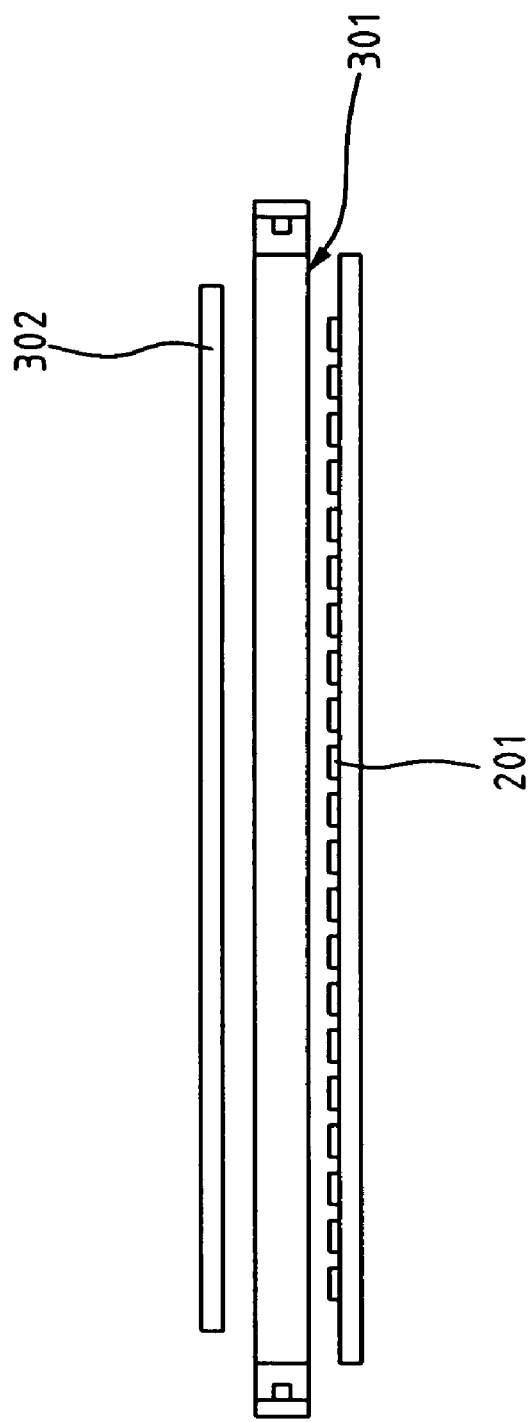
FIG. 3 shows a side elevational view of the LCD backlight shown in FIG. 2.
Figure 4:
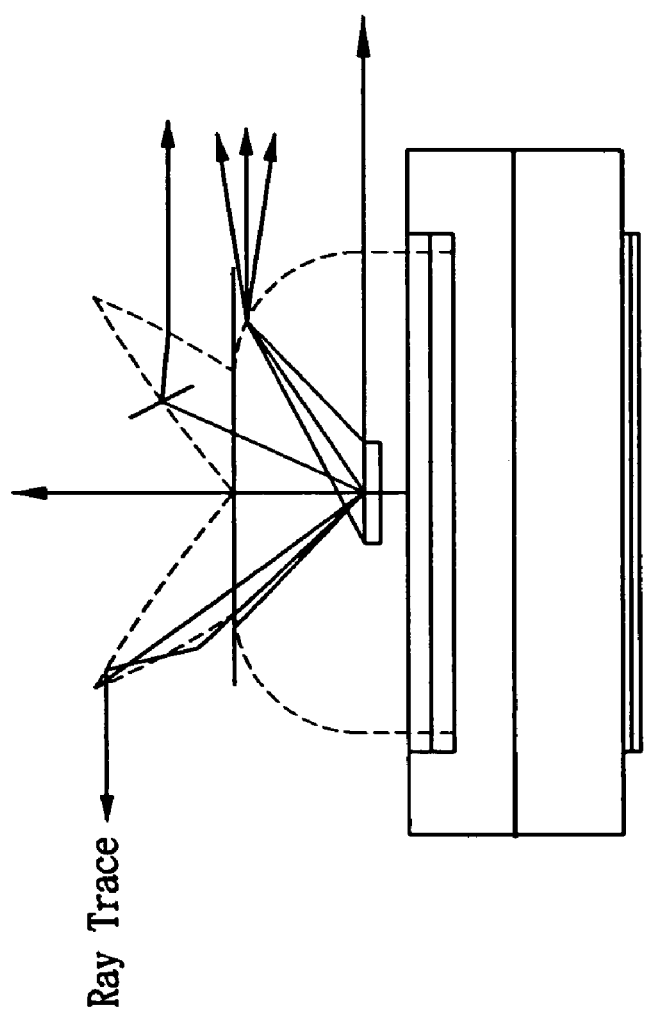
FIG. 4 shows a Luxeon side-emitter.
Figure 5:
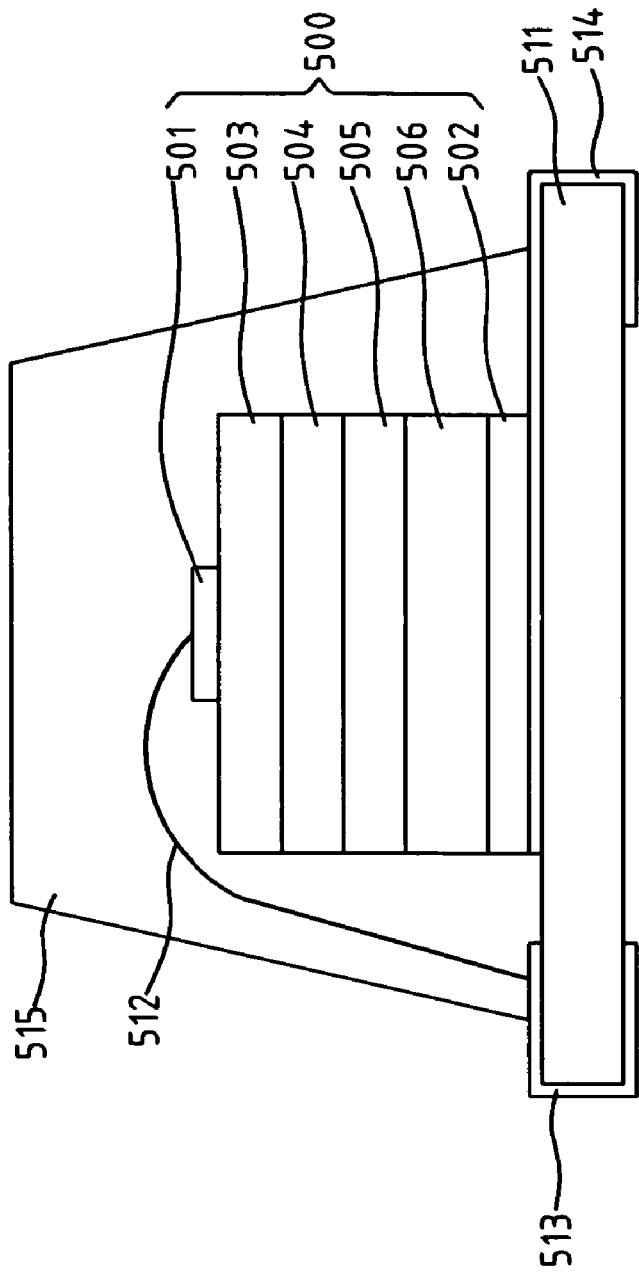
FIG. 5 shows a cross-sectional structure of a conventional LED package.
Figure 6B:
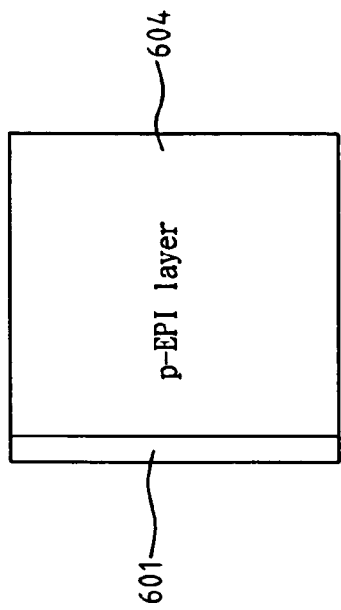
FIG. 6B shows a top view of the bonding pad extended from edge to edge of an LED chip according to the present invention.
Figure 6C:
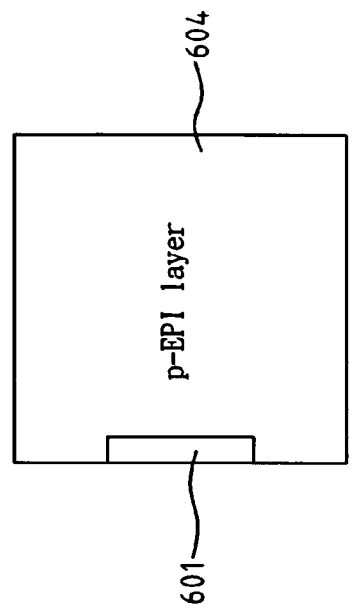
FIG. 6C shows a top view of the bonding pad located in the edge center of an LED chip according to the present invention.
Figure 6A:
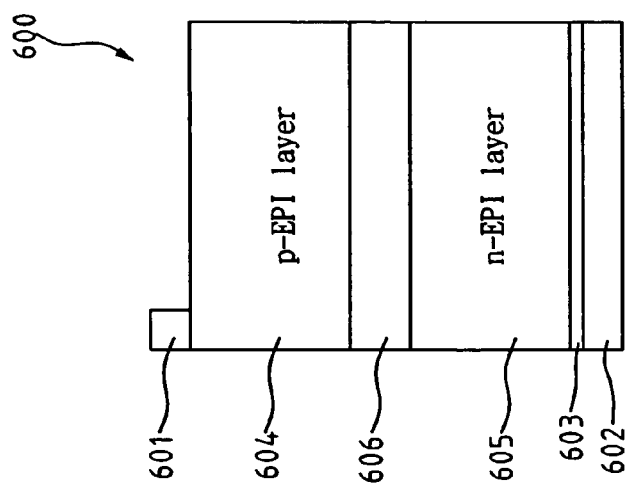
FIG. 6A shows a side view of an LED chip.

FIG. 6A shows a side view of an LED chip. Every LED chip has an n-bonding pad and a p-bonding pad. Referring to FIG. 6A, the LED chip 600 has two bonding pads 601 and 602, i.e. n-bonding pad and p-bonding pad respectively. These two bonding pads 601 and 602 are located on the front surface and on the back surface of the LED chip 600, respectively. The bonding pads 601 and 602 are also located on the opposite sides of the surfaces of expitaxial (EPI) layers 604 and 605. One EPI layer is referred to p-EPI layer, and the other is referred to n- EPI layer. Either n- or p-bonding pad can be disposed on the front surface of the LED chip 600 and occupies only a small fraction of the chip area. In the LED chip, the bonding pad 602 covers the entire back surface of the LED chip, while the bonding pad 601 covers 600 a small fraction of the chip area. The edge of the front bonding pad 601 is flush with the edge of the LED chip 600. The LED chip 600 has a light emitting layer 606 placed in between the EPI layers 604 and 605, and a metal reflection layer 603 placed in between the EPI layer 605 and the bonding pad 602.

Moreover, the front bonding pad 601 can be extended from edge to edge (as shown in FIG. 6B) or placed in the edge center of the chip 600 (as shown in FIG. 6C). The other bonding pad 602 covers the entire back surface of the LED chip 600.

Figure 7A:
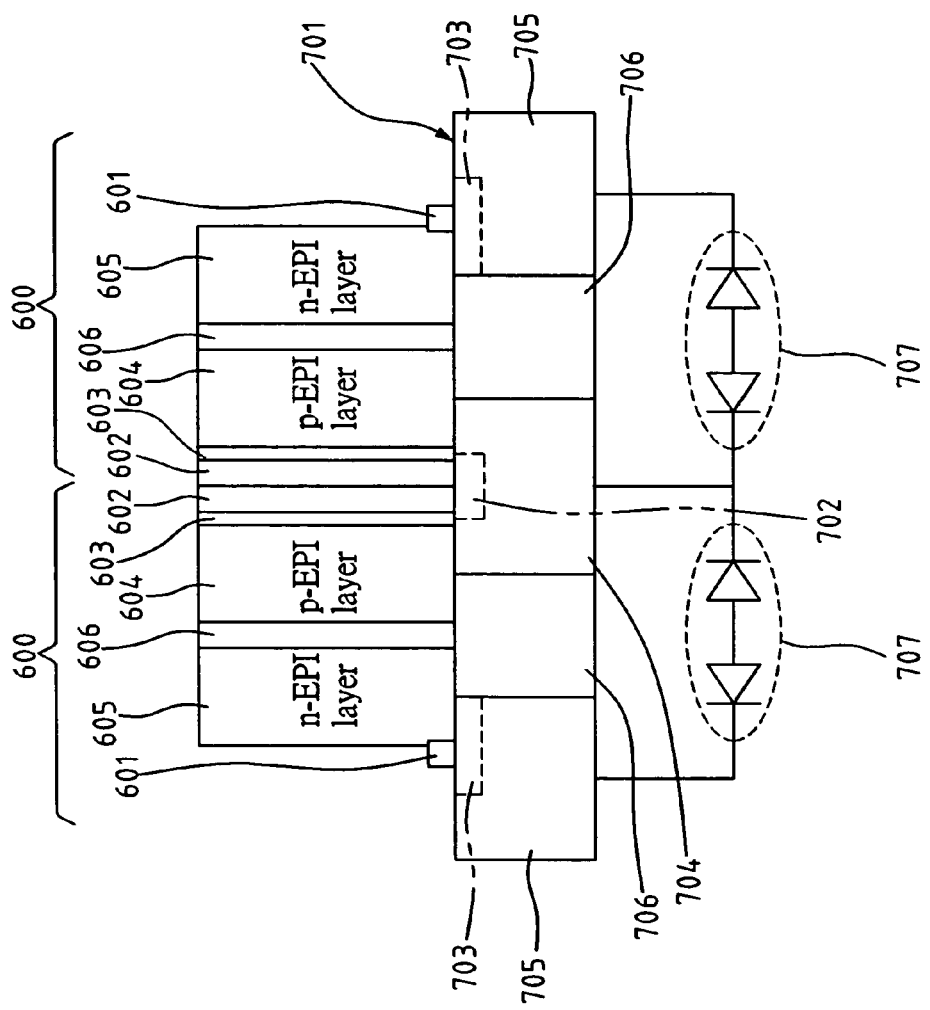
FIG. 7A shows a side view of the lighting device with flipped side-structure of LEDs according to a first embodiment of the present invention.

FIG. 7A shows a side view of the lighting device with flipped side-structure of LEDs according to a first embodiment of the present invention. In the first embodiment of the invention, the lighting device with flipped side-structure of LEDs comprises one or more LED chips and a substrate. The substrate includes at least one n-electrode pad and at least one p-electrode pad, and has a substrate surface. Without loss of generality, two LED chips, one n-electrode pad and two p-electrode pads are taken as examples in the embodiment of FIG. 7A.

Referring to FIG. 7A, two LED chips 600 are attached back-to-back and mounted on the substrate 701 with their side surfaces facing the mounting surface, as shown in FIG. 7A. The n-bonding pad 602 and p-bonding pad 601 of the LED chip 600 are bonded to the n-electrode pad 704 and p-electrode pad 705 of the substrate 701, respectively. It does not require a conventional wire bonding process. The n-electrode 704 and p-electrode 705 are separated by a dielectric material 706. Electrostatic discharge (ESD) protection circuits 707 may be included in the light device if desired. In addition, submount bonding pads, 702 and 703, may also be included in the substrate 701 if desired, as shown in FIG. 7A.

Figure 7B:
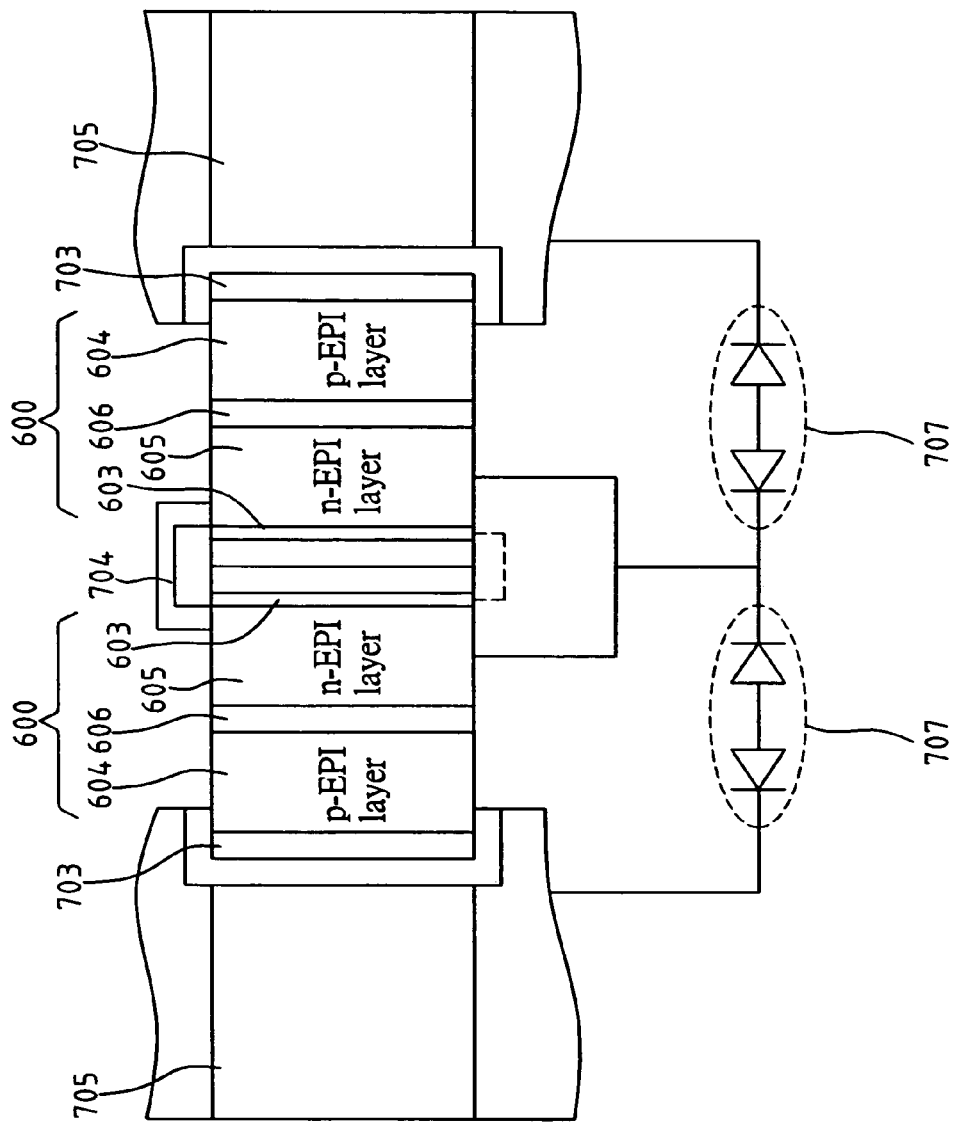
FIG. 7B shows a top view of the lighting device with flipped side-structure of LEDs according to the first embodiment of the present invention.

FIG. 7B shows a top view of the lighting device with flipped side-structure of LEDs according to the first embodiment of the present invention. Without loss of generality, a plurality of the n-electrode pads and p-electrode pads can be patterned such that an array of LEDs are connected together in a serial manner and/or in a parallel manner. The packaging structure of the present invention also resolves the heat dissipation problem of the LED device.

With the lighting device with flipped side-structure of LEDs, the emitted lights can travel in parallel with a mounting surface. It eliminates the need of a conventional wire bonding process and a package for encasing an LED chip, and thus reduces cost and space. The lighting device with flipped side-structure of LEDs can be further combined with optical protrusions on the substrate to form a light module for reflecting and mixing lights emitted from the LED chips to meet desired applications. A high light intensity with desired chromaticity is also achieved due to a high LED packaging density and a proper mix of emitted lights.

Figure 8:
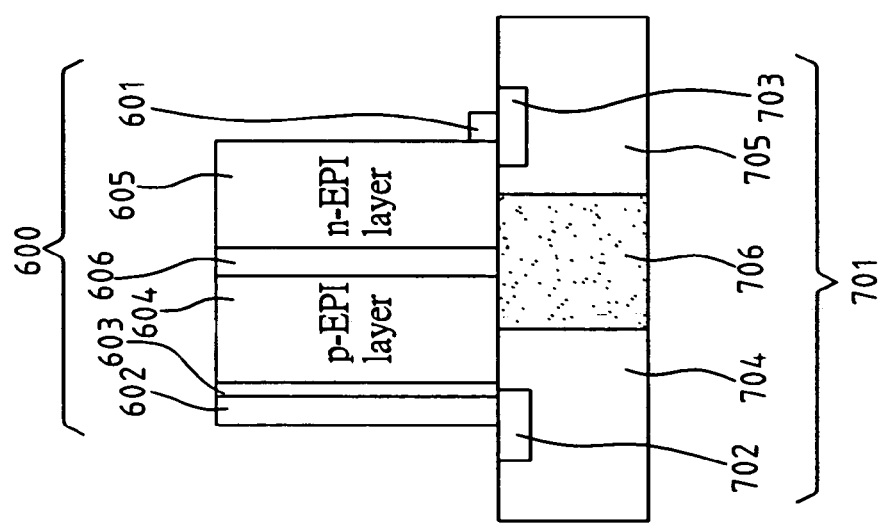
FIG. 8 shows a side view of the lighting device with flipped side-structure of LEDs according to a second embodiment of the present invention.

FIG. 8 shows a side view of a lighting device with flipped side-structure of LEDs according to a second embodiment of the present invention. In the second embodiment of FIG. 8, the lighting device with flipped side-structure of LEDs comprises an LED chip 600 and a substrate 701. The LED chip 600 is mounted on the substrate 701 with its side surface facing the mounting surface. The n-bonding pad 602 and p-bonding pad 601 of the LED chip are bonded to the n-electrode pad 702 and p-electrode pad 703 on the substrate, respectively.

These LED chips can be encapsulated with a transparent material to prevent the LED chips from reacting with air. Furthermore, total reflection can be avoided if the refractive index of the transparent material is properly selected. The transparent material can be chosen from the group of, but not limited to, epoxy and silicone.

Figure 9:
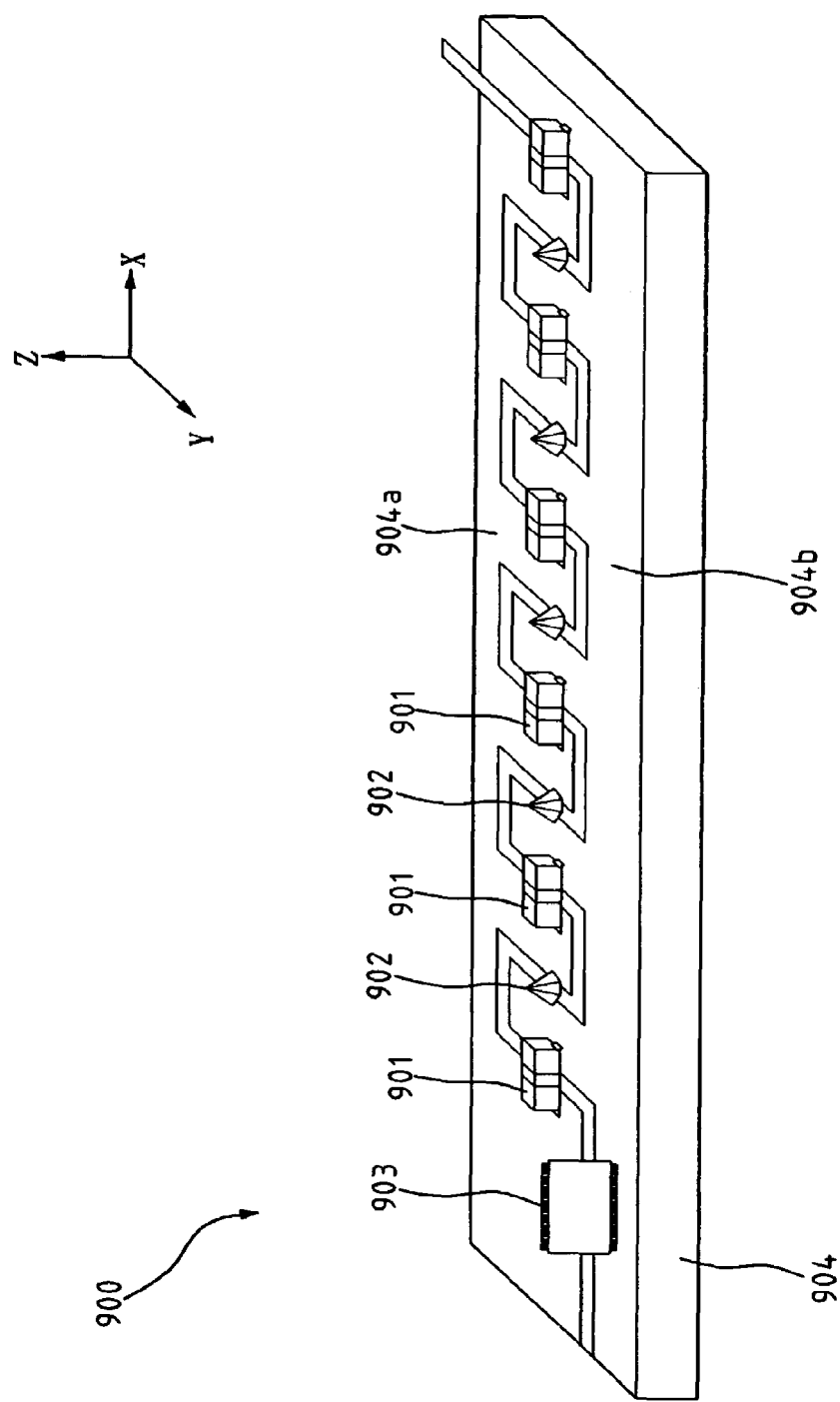
FIG. 9 shows a lighting device with flipped side-structure of LEDs according to a third embodiment of the present invention, wherein the lighting device is an application example of an LED luminance strip.

FIG. 9 shows a lighting device with flipped side-structure of LEDs according to a third embodiment of the present invention. Wherein the lighting device is an application example of an LED luminance strip. In the third embodiment, the lighting device 900 with flipped side-structure of LEDs is further combined with optical protrusions 902 on the substrate 904 to form a light module for reflecting and mixing lights emitted from the LED chips. Wherein, the lighting device 901 with flipped side-structure of LEDs is chosen from the first embodiment or the second embodiment of the present invention. The substrate 904 has the n-electrode plate 904a and the p-electrode 904b thereon.

Figure 10A:
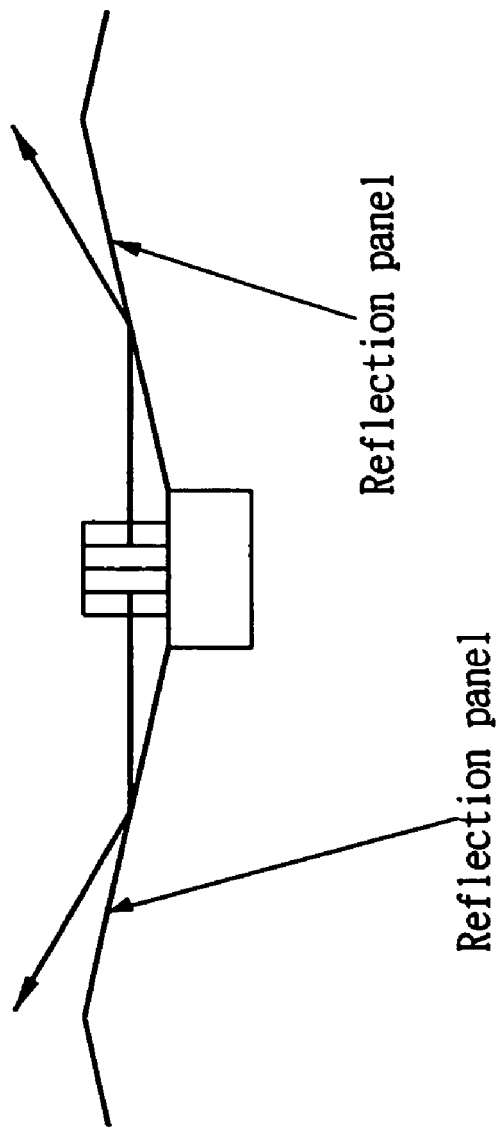
FIGS. 10A and 10B show a side view and a top view of the light trace of the LED luminance strip shown in FIG. 9, respectively.
Figure 10B:
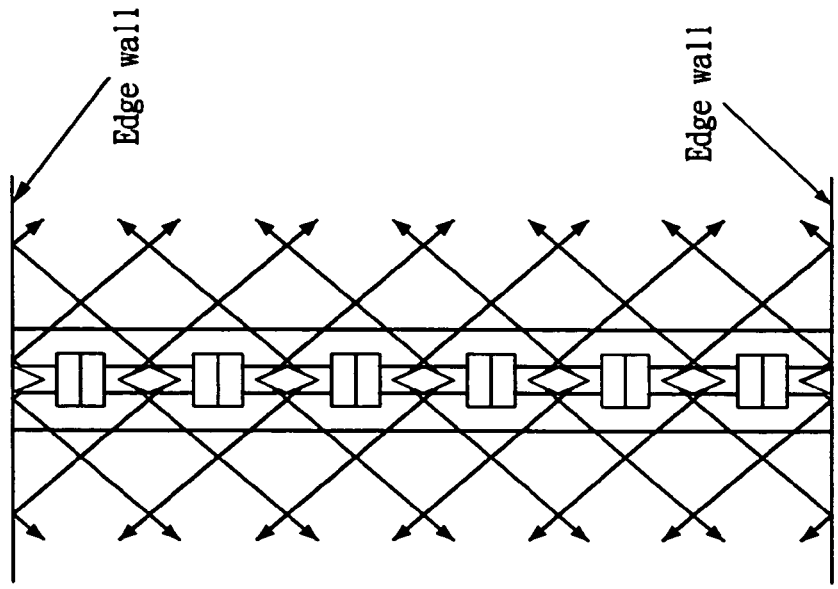

According to desired applications, the optical protrusions 902 can be formed in any suitable manner and shape and made of any suitable material. The shape of the optical protrusions 902 can be, but not limited to, pyramidal or conic or parabolic or semispherical. FIGS. 10A and 10B show a side view and a top view of the light trace of the LED luminance strip shown in FIG. 9, respectively. The LED luminance strip emits most of the light in parallel with its mounting surface and toward optical protrusions. The light is therefore mixed with those emitted from others.

If desired, a control circuitry 903 (shown in FIG. 9) can be formed on the substrate surface to power up the LEDs, to control the brightness of the LEDs, to provide electrostatic discharge protection for the LEDs, and to adjust the chromaticity of the combined light to meet desired applications. The control circuitry 903 may be stacked or printed on the substrate surface.

Figure 11:
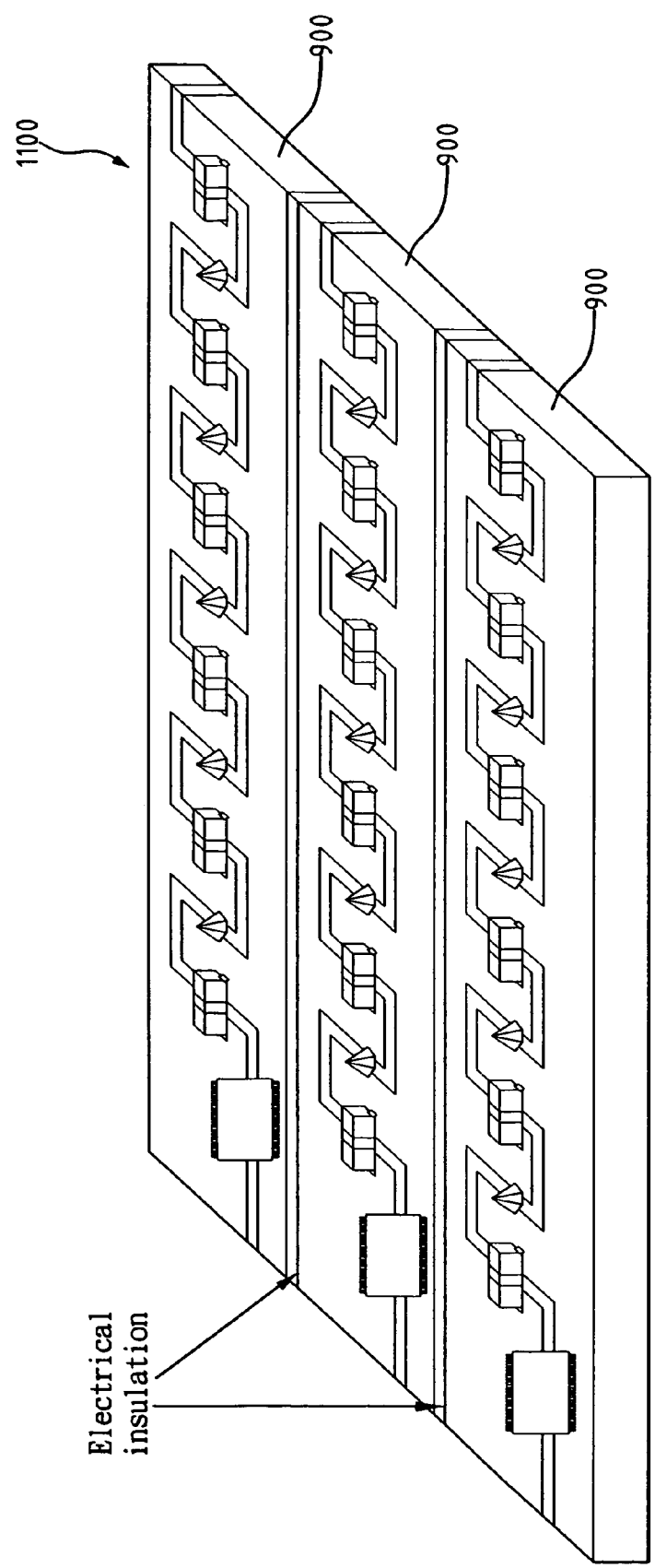
FIG. 11 is an application example of an LED luminance panel formed by plural LED luminance strips shown in FIG. 9.

FIG. 11 is an application example of an LED luminance panel 1100 formed by plural LED luminance strips shown in FIG. 9. Electrical insulation is provided between two LED luminance strips.

The lighting device of the present invention can be incorporated in a light source, such as an LED lamp. FIGS. 12A and 12B are application examples of an LED lamp without or with a reflective bowl according to the third embodiment of the present invention.

Figure 12C:
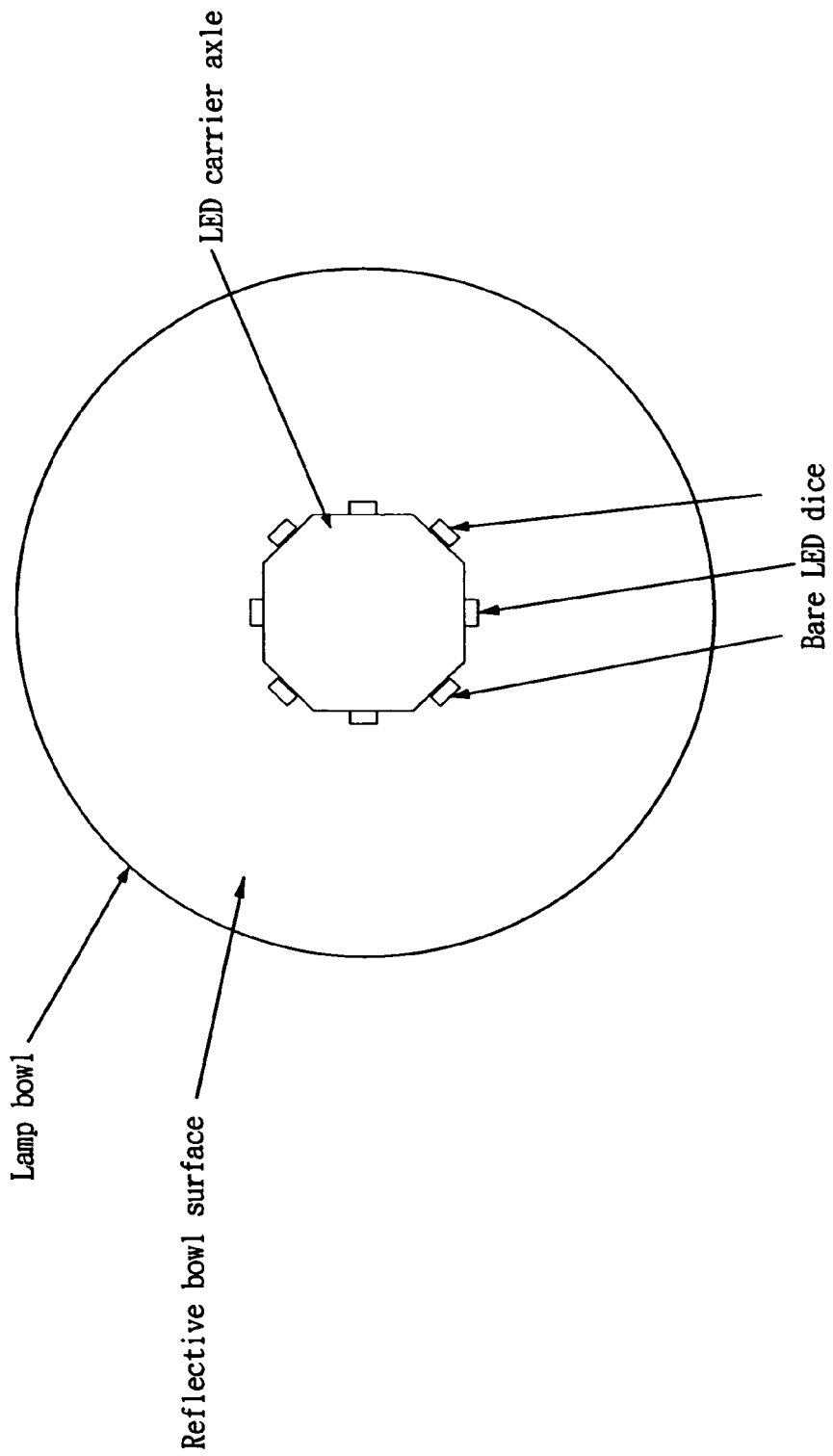
FIG. 12C is a front view of an LED lamp with a reflective bowl shown in FIG. 12B.

Referring to application examples shown in FIGS. 9, 11, and 12A, the lighting devices are formed on a substrate facing the optical protrusions to form an LED luminance sources. Therefore, the emitted lights from different LEDs have a chance to be reflected and combined near the substrate surface in order to achieve desired chromaticity. FIG. 12B is an application example of FIG. 12A combined with a reflective bowl 1201. FIG. 12C is a front view of the LED lamp with a reflective bowl shown in FIG. 12B.

The present invention achieves good uniformity and high intensity of the combined lights with desired chromaticity. The combined lights emitted from the light module can be further directed towards a light diffuser or a wave guide. The lighting device with flipped side-structure of LEDs of this invention can be incorporated in a backlight module for a liquid-crystal display, regardless the size of its LCD panel.

Figure 13A:
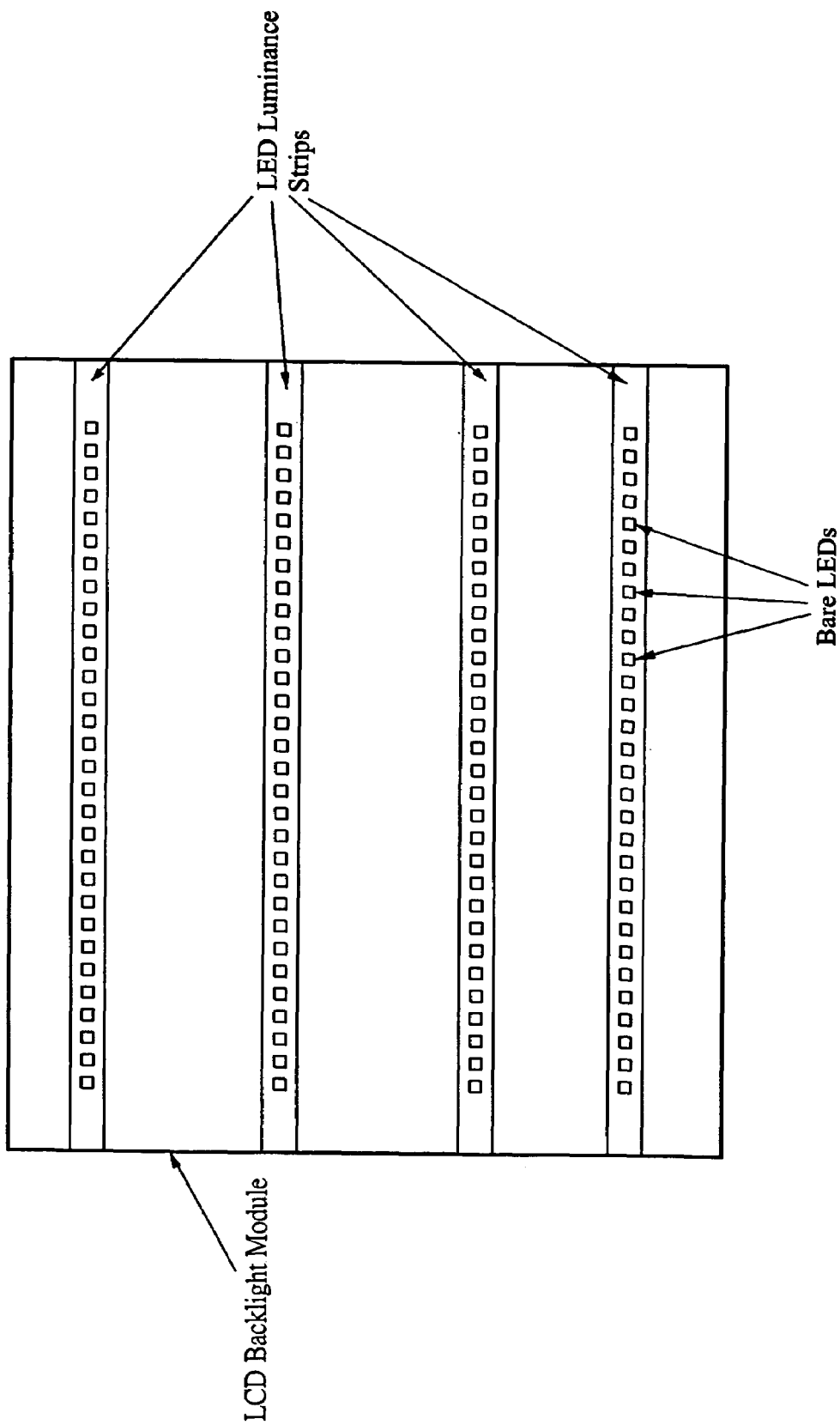
FIGS. 13A and 13B are application examples of an LED luminance strip and an LED luminance panel that are incorporated in a backlight module for an LCD, respectively.
Figure 13B:
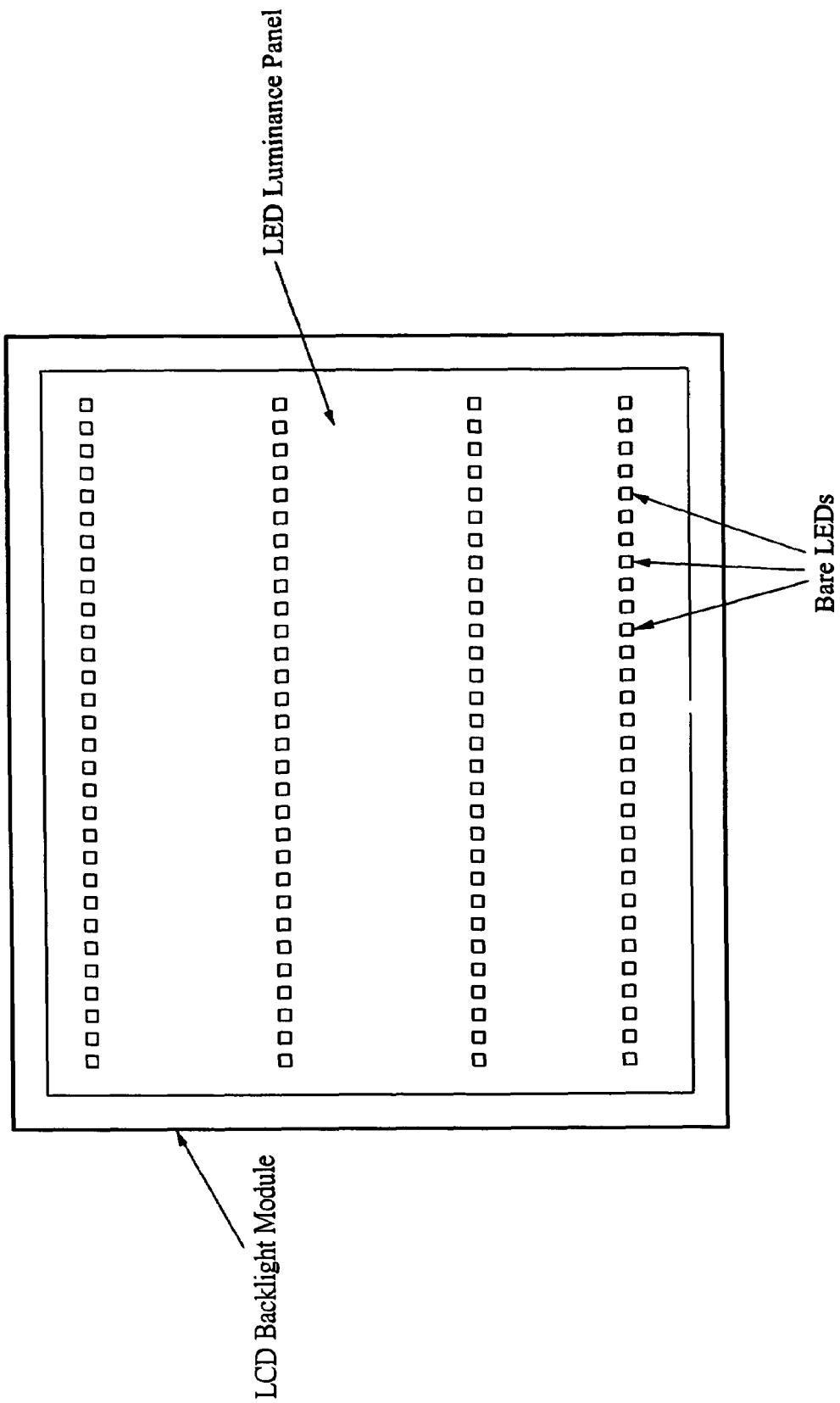

FIGS. 13A and 13B are application examples of an LED luminance strip and an LED luminance panel that are incorporated in a backlight module for an LCD, respectively.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A lighting device with flipped side-structure of light emitting diodes (LEDs), comprising:
    a substrate including at least one n-electrode pad and at least one p-electrode pad, and having a substrate surface; and
    at least two LED chips attached back-to-back and mounted on said substrate, wherein each of said LED chips has an n-bonding pad and a p-bonding pad, one of the two bonding pads is located on a front surface occupying only a small fraction of the chip area of the LED chip and the other bonding pad on a back surface covering the entire back surface of the LED chip, said LED chips are mounted on said substrate with their side surfaces facing said substrate surface, and the n-bonding pads and p-bonding pads of said LED chips are bonded to their corresponding n-electrode pads and p-electrode pads of said substrate, respectively.

2. The lighting device with flipped side-structure of LEDs as claimed in claim 1, wherein for each of said LED chips, a metal reflection layer is formed in between the bonding pad on the back surface and the remaining part of the LED chip.

3. The lighting device with flipped side-structure of LEDs as claimed in claim 1, wherein for each of said LED chips, the edge of the bonding pad on the front surface is flush with the edge of the LED chip.

4. The lighting device with flipped side-structure of LEDs as claimed in claim 1, wherein a plurality of the n-electrode pads and p-electrode pads are patterned so that an array of LEDs are connected together in a serial manner and/or in a parallel manner.

5. The lighting device with flipped side-structure of LEDs as claimed in claim 1, wherein each of said LED chips is a bare LED chip encapsulated with a transparent material.

6. The flipped side-structure LED device as claimed in claim 5, wherein said transparent material is chosen from the group of epoxy and silicone.

7. The lighting device with flipped side-structure of LEDs as claimed in claim 1, wherein said lighting device further includes electrostatic discharge protection circuits.

8. The lighting device with flipped side-structure of LEDs as claimed in claim 1, wherein for each of said LED chips, the bonding pad on the front surface is placed in the edge center of the front surface of the LED chip.

9. The lighting device with flipped side-structure of LEDs as claimed in claim 1, wherein for each of said LED chips, the bonding pad on the front surface is extended from edge to edge of the LED chip.

10. A lighting device with flipped side-structure of light emitting diodes (LEDs), comprising:
    a substrate including at least one n-electrode pad and at least one p-electrode pad, and having a substrate surface; and one or more LED chips mounted on said substrate, wherein each of said LED chips has an n-bonding pad and a p-bonding pad, one of the two bonding pads is located on a front surface occupying only a small fraction of the chip area of the LED chip and the other bonding pad on a back surface covering the entire back surface of the LED chip, said LED chips are mounted on said substrate with their side surfaces facing said substrate surface, and the n-bonding pads and p-bonding pads of said LED chips are bonded to their corresponding n-electrode pads and p-electrode pads of said substrate, respectively;

wherein said lighting device further comprises at least one optical protrusion located on said substrate to form a light module for reflecting and mixing lights emitted from said LED chips.

11. The lighting device with flipped side-structure of LEDs as claimed in claim 10, wherein the shapes of the optical protrusions include pyramidal, conic, parabolic, and semispherical shapes.

12. The lighting device with flipped side-structure of LEDs as claimed in claim 10, wherein a control circuitry is further formed on said substrate surface to power up said LED chips, to control the brightness of said LED chips, to provide electrostatic discharge protection for said LED chips, and to adjust the chromaticity of emitted light of said light device to meet desired applications.

13. The lighting device with flipped side-structure of LEDs as claimed in claim 12, wherein said control circuitry is stacked on said substrate.

14. The lighting device with flipped side-structure of LEDs as claimed in claim 12, wherein said control circuitry is printed on said substrate.

15. The lighting device with flipped side-structure of LEDs as claimed in claim 10, wherein said LED chips are mounted onto said substrate in a way so that their chip surfaces face the optical protrusions.

16. The lighting device with flipped side-structure of LEDs as claimed in claim 10, wherein said lighting device is incorporated in a backlight module for a liquid crystal display.

17. The lighting device with flipped side-structure of LEDs as claimed in claim 10, wherein a plurality of the lighting devices are incorporated in a backlight module for a liquid crystal display.

18. The lighting device with flipped side-structure of LEDs as claimed in claim 17, wherein electrical insulation is provided between two of the lighting devices.

19. The lighting device with flipped side-structure of LEDs as claimed in claim 18, wherein said light source is an LED lamp that is formed by said lighting device combined with or without a reflective bowl.

20. The lighting device with flipped side-structure of LEDs as claimed in claim 10, wherein said lighting device is incorporated in a light source.

* * * * *